United States Patent
Tseng et al.

(10) Patent No.: US 9,244,223 B2
(45) Date of Patent: Jan. 26, 2016

(54) LIGHT COUPLING FORMATION IN A WAVEGUIDE LAYER

(71) Applicant: TAIWAN SEMICONDUCTOR MANUFACTURING COMPANY, LTD., Hsinchu (TW)

(72) Inventors: Chun-Hao Tseng, Taichung (TW); Ying-Hao Kuo, Hsinchu (TW); Kuo-Chung Yee, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 62 days.

(21) Appl. No.: 14/075,186

(22) Filed: Nov. 8, 2013

(65) Prior Publication Data

US 2015/0131938 A1 May 14, 2015

(51) Int. Cl.
G02B 6/122 (2006.01)
H01L 31/0203 (2014.01)
H01L 31/0232 (2014.01)
G02B 6/138 (2006.01)

(52) U.S. Cl.
CPC ............... *G02B 6/122* (2013.01); *G02B 6/138* (2013.01); *H01L 31/0203* (2013.01); *H01L 31/02325* (2013.01)

(58) Field of Classification Search
None
See application file for complete search history.

(56) References Cited

U.S. PATENT DOCUMENTS

| | | | | |
|---|---|---|---|---|
| 5,471,552 A * | 11/1995 | Wuu et al. | | 385/49 |
| 6,477,284 B1 * | 11/2002 | Oda et al. | | 385/14 |
| 7,113,683 B2 * | 9/2006 | Hayamizu et al. | | 385/129 |
| 2004/0126053 A1* | 7/2004 | Ouchi | | 385/14 |
| 2014/0334768 A1* | 11/2014 | Chang et al. | | 385/14 |

* cited by examiner

*Primary Examiner* — Ryan Lepisto
*Assistant Examiner* — Erin Chiem
(74) *Attorney, Agent, or Firm* — Slater & Matsil, L.L.P.

(57) ABSTRACT

An approach is provided for forming a light coupling in a waveguide layer. The approach involves forming a waveguide layer overlaying an upper surface of a substrate. The approach also involves placing a chip package portion within the waveguide layer in a selected position. The approach further involves forming a molding compound layer overlaying the waveguide layer and the chip package portion. The approach additionally involves curing the molding compound layer to form a cured package. The approach also involves releasing the cured package from the substrate and inverting the cured package. The approach further involves forming a ridge waveguide structure in the waveguide layer by removing a portion of the lower surface of the cured package.

20 Claims, 5 Drawing Sheets

LIGHT COUPLING FORMATION IN A WAVEGUIDE LAYER

BACKGROUND

Device manufacturers are continually challenged to deliver microchip packages that have low manufacturing costs while offering high quality and reliability.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Waveguides are used to control a propagation of light from one element to another. Waveguides are used in image sensors, optical communications, opto-electric circuits, spectrum analysis devices as well as other technologies.

Some planar lightwave circuits direct light into waveguide structures involving complicated coupling techniques such as gratings or micro-lenses. Directing light using gratings or micro-lenses, for example, often necessitates tight process control and/or active alignment to achieve desired precision. Additionally, some planar lightwave circuits that use gratings, for example, have limited available incident angles for receiving light from a light source such as a laser diode that is often positioned a particular distance above the applicable waveguide structure. Placement of a light source above the applicable waveguide structure increases the amount of space occupied by some chip packages.

Figure 1A:
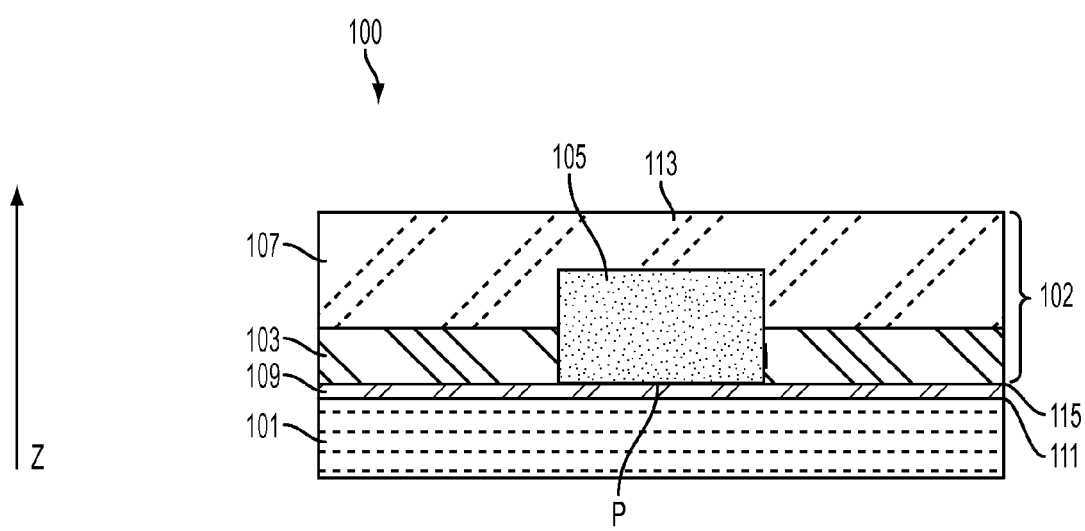
FIGS. 1A-1C are cross sectional views of a chip package having a light coupling in a waveguide layer, in accordance with one or more embodiments.
Figure 1B:
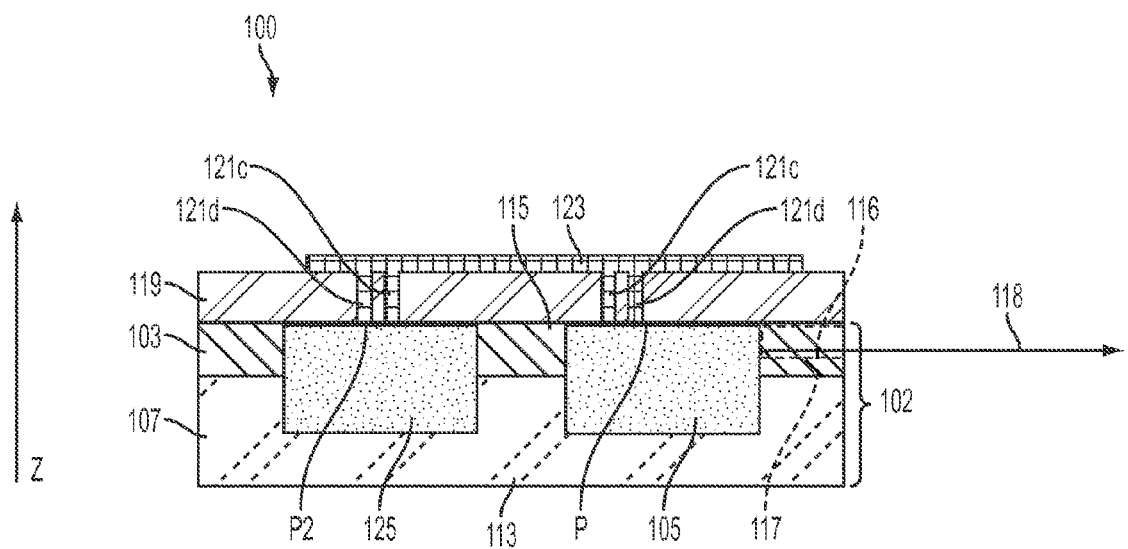
Figure 1C:
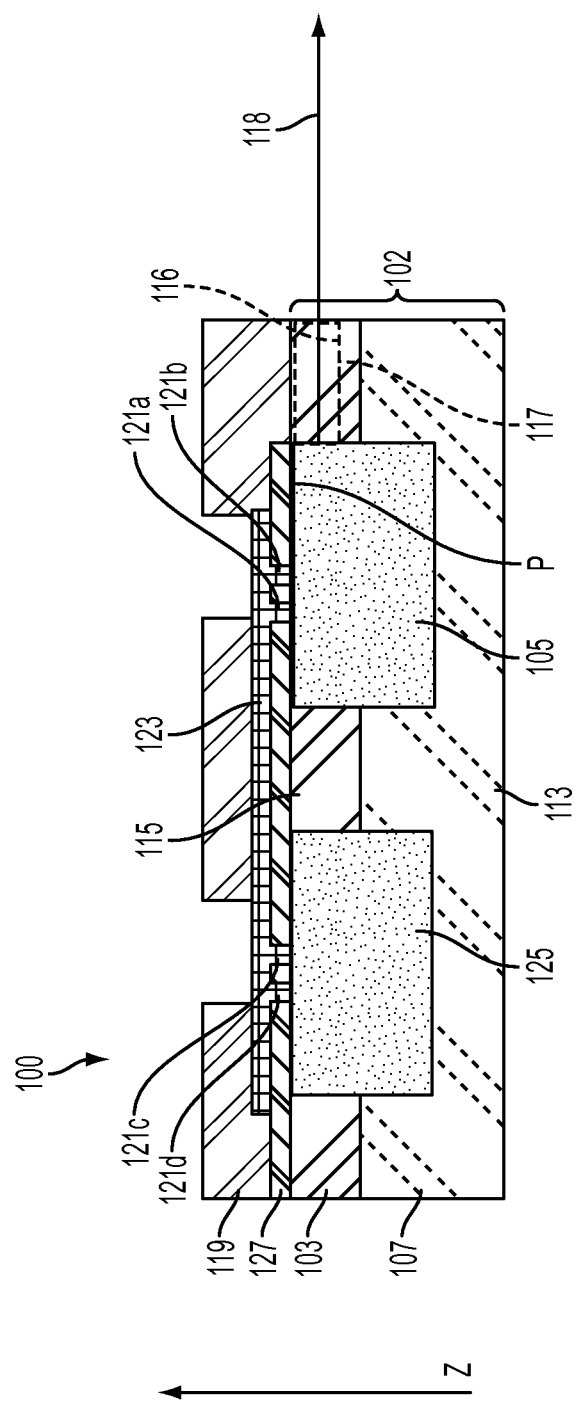

FIGS. 1A-1C are cross sectional views of a chip package 100 having a light coupling in a waveguide layer, according to one or more embodiments.

FIG. 1A illustrates a cured package 102 formed on a substrate 101. The cured package 102, in some embodiments, comprises a waveguide layer 103, a chip package portion 105, and a molding compound layer 107.

In some embodiments, substrate 101 comprises a silicon, glass, ceramic, metal, polymer and the like.

In one or more embodiments, an adhesive layer 109 is applied to an upper surface 111 of the substrate 101 to enhance formation of the cured package 102. In some embodiments, the adhesive layer 109 is one or more of a film, an adhesive tape such as a thermal or release tape such as a UV release tape, for example, a polymer, a gel, and the like optionally applied by any of a roller, a lamination process, a spin coat, and the like.

In some embodiments, the adhesive layer 109 is treated to eliminate any bubbling that is present resulting from formation of the adhesive layer 109.

In some embodiments, the waveguide layer 103 is formed overlaying the upper surface 111 of the substrate 101. In some embodiments, the waveguide layer 103 is also formed overlaying the adhesive layer 109, which also overlies the upper surface 111 of the substrate 101. In one or more embodiments, the waveguide layer 103 comprises polyimide, epoxy, polymer, dielectric material, and the like. According to various embodiments, the waveguide layer 103 is formed by way of any spin coat or deposition process.

According to various embodiments, the chip package portion 105 such as a light source or laser diode is placed within the waveguide layer 103 in a selected position P. In some embodiments, the chip package portion 105 is placed in the selected position P such that the chip package portion 105 contacts the adhesive layer 109. The chip package 100, having the light coupling in the waveguide layer 103, makes it possible for light from a light source such as a laser diode to be directly coupled into waveguides in a planar lightwave circuit (PLC) with accurate z-directional control without costly or tedious tight process controls or active alignment systems. Having accurate light source positioning without tight process controls or active alignment systems reduces the complexity of the chip package 100. Reduced complexity increases reliability and, in some embodiments, reduces production time. Reduced complexity also limits the possibility of introducing errors in a manufacturing process associated with forming the chip package 100, thereby improving quality. Additionally, a space occupied by the chip package 100 is capable of being reduced to a minimum.

In some embodiments, the chip package portion 105 is placed in the selected position P when the waveguide layer 103 is in a soft or liquid state. For example, in some embodiments, the chip package portion 105 is placed into the selected potion P when the waveguide layer 103 in a soft bake or low cross-linking condition after the waveguide layer 103 is formed, e.g., at room temperature. In other embodiments, the chip package portion 105 is placed in the selected position P at a time when the waveguide layer 103 is in a partially cured state. For example, in some embodiments, the waveguide layer 103 is partially cured by a post baking or curing process after the waveguide layer is provided. In some embodiments, placing the chip package portion into the selected position P involves dropping the chip package portion 105. When the waveguide layer 103 is partially cured, the chip package portion 105 is placed in the selected position P under an elevated temperature that is higher than a melting point of the waveguide layer 103, and the chip package portion 105 is placed, pressed, or dropped into the waveguide layer 103 to place the chip package portion 105 at the selected position P.

In some embodiments, the waveguide layer 103 is subjected to a curing process to cure the waveguide layer 103 and to secure the chip package portion 105 in the selected position P. In some embodiments, it is possible to use the waveguide layer 103 as the adhesive layer 109, or to eliminate the adhesive layer 109 all together, relying on the waveguide layer 103 to secure the chip package portion 105 in the selected position P during curing of the waveguide layer 103, for example.

In some embodiments, the molding compound layer 107 is formed overlaying the waveguide layer 103 and the chip package portion 105. The molding compound layer 107, in some embodiments, is provided in liquid form. In other embodiments, the molding compound layer 107 is provided in a sheeted form by a thermal compression or lamination process, for example.

In some embodiments, the molding compound layer 107 is subjected to a curing process that hardens or solidifies the molding compound layer 107 and forms the cured package 102. The molding compound layer 107, in some embodiments, is provided at temperature in a range from about 100° C. to about 150° C. for a period of time from approximately 1 to 10 minutes. The molding compound layer 107, in various embodiments, is provided at any temperature range and for any period of time that enables formation of the molding compound layer 107. In some embodiments, the curing process occurs in a temperature range from about 100° C. to about 200° C. for a period of time from approximately 1 to 5 hours. The curing process, in various embodiments, occurs at any temperature and for any duration of time that is sufficient to cure the molding compound layer 107.

The chip package portion 105 is secured in the position P during the curing process associated with curing the molding compound layer by the cured waveguide layer 103 and/or the adhesive layer 109. Accordingly, in some embodiments, accurate positional control of a light source in the chip package 100 is achieved by using, for example, a die bonding process to place the chip package portion 105 within the waveguide layer 103.

In some embodiments, the molding compound layer is configured to minimize light absorption. For example, in one or more embodiments, the molding compound layer is configured to exclude carbon black additives, particles or compounds. In various embodiments, the molding compound layer 107 functions as a clad layer to limit the number of processes for fabricating the chip package 100.

The cured package 102 includes the waveguide layer 103, the chip package portion 105 and the molding compound layer 107. The cured package 102 has an upper surface 113 distal the upper surface 111 of the substrate 101 and a lower surface 115 proximate the upper surface 111 of the substrate 101.

FIG. 1B is a cross sectional view of the cured package 102 having been released from the substrate 101 and inverted, according to one or more embodiments.

In some embodiments, the cured package 102 is released from the substrate 101 and inverted. Once inverted, a ridge waveguide structure 117 is formed. In some embodiments, the ridge waveguide structure is formed by removing a portion of the lower surface 115 of the cured package 102. In some embodiments, the ridge waveguide structure 117 is formed in the waveguide layer 103 by an etching process. For example, in some embodiments, the lower surface 115 is etched to remove a portion of the waveguide layer 103 leaving the ridge waveguide structure 117. In some embodiments, etching the waveguide layer 103 forms a waveguide layer surface 116 in one or more regions of the waveguide layer 103 excluded from the ridge waveguide structure 117.

In some embodiments, the ridge waveguide structure 117 is formed separately from the waveguide layer 103. For example, in some embodiments, an etching, cutting or grinding process removes a portion of the waveguide layer 103 and the ridge waveguide structure 117 is formed within a space made available by removing the portion of the waveguide layer 103 in a level associated with the waveguide layer 103.

According to various embodiments, the chip package portion 105 is a light source such as a laser diode. In some embodiments, the chip package portion 105 is configured to emit collimated light. In one or more embodiments, the chip package portion 105 is configured to emit non-collimated light. The chip package portion 105, accordingly, is configured to emit a light 118 through the ridge waveguide structure 117.

According to various embodiments, because the chip package portion 105 is placed in the selected position P and secured in the selected position P by the waveguide layer 103 and/or the adhesive layer 109, the selected position P being one that abuts the upper surface 111 of the substrate 101, the chip package portion 105 is readily aligned in the z-direction with the ridge waveguide structure 117 upon formation of the ridge waveguide structure 117.

In some embodiments, an upper clad layer 119 overlaying one or more of the lower surface 115 of the cured package 102, the ridge waveguide structure 117, and the waveguide layer surface 116 is formed. The upper clad layer 119, in some embodiments, comprises a polymer and/or dielectric material that is spin coated or deposited to overlay one or more of the lower surface 115 of the cured package 102, the ridge waveguide structure 117, and the waveguide layer surface 116. In some embodiments, the upper clad layer 119 is part of a tri-layer waveguide structure having a lower clad layer formed by the molding compound layer 107, the waveguide layer 103 and the upper clad layer 119. In some embodiments, the upper clad layer 119 covers one or more sidewall portions of the ridge waveguide structure 117.

In various embodiments, one or more vias 121a-121d are formed through the upper clad layer 119. In some embodiments, a redistribution layer 123 is formed overlaying the upper clad layer 119. In some embodiments, if the redistribution layer 123 is formed overlaying the upper clad layer 119, the upper clad layer 119 is used as a redistribution layer dielectric. The redistribution layer 123 is communicatively connected to the chip package portion 105 by way of the one or more vias 121a-121d.

In some embodiments, the redistribution layer 123 is formed by way of lithography and an electrochemical plating processes. In various embodiments, the redistribution layer comprises any conductive material such as, but not limited to, copper, aluminum, gold, etc.

According to various embodiments, the chip package 100 also includes another chip package portion 125. The another chip package portion 125, in some embodiments, is placed within the waveguide layer 103 at a selected position P2 corresponding to a positional placement of the another chip package portion 125 in the same manner as the chip package portion 105 is placed at the selected position P. In other embodiments, the another chip package portion 105 is placed at the selected position P2 within the waveguide layer 103 in a manner other than the manner that the chip package portion 105 is placed at the selected position P. According to various embodiments, the another chip package portion 125 is any integrated circuit, processor, controller, or the like, configured to one or more of be in communication with the chip package portions 105 and control the chip package portion 105, for example. As such, in some embodiments, the another chip package portion 125 is communicatively coupled to the chip package portion 105 by way of the redistribution layer 123, any other dielectric layer, and/or the vias 121a-121d.

FIG. 1C is a cross sectional view of the cured package 102 having been released from the substrate 101 and inverted, according to one or more embodiments.

In some embodiments, one or more dielectric layers 127 are formed overlaying the lower surface 115 of the cured package 102. In various embodiments, the one or more dielectric layers 127 comprise material such as, but not limited to, polyimide and/or polybenzoxazole.

In these embodiments, the one or more vias 121a-121d are formed through the one or more dielectric layers 127. The redistribution layer 123 is formed overlaying the one or more dielectric layers 127. The redistribution layer 123 is communicatively connected to the chip package portion 105 and/or the another chip package portion 125 by way of the one or more vias 121a-121d. In some embodiments, the upper clad layer 119 is formed overlaying the redistribution layer 123 by way of a spin coat or deposition process. In some embodiments, the one or more openings are formed in the upper clad layer 119 allow for electrical connectivity between the redistribution layer 123 to external a connector such as, but not limited to, solder bumps, through bumps, conductive columns, other suitable connectors to facilitate bonding to a printed circuit board, another substrate, layer etc. Other areas of the upper clad layer 119 that cover the redistribution layer 123 are configured, in some embodiments, to be a passivation layer.

Regardless of orientation, in various embodiments, a refractive index difference between one or more of the upper clad layer 119, the molding compound layer 107 and the waveguide layer 103 is greater than about 0.025. In some embodiments, the refractive index difference is determined based on light emission of about a "sodium D-line" wavelength. In one or more embodiments, the refractive index difference is based on a selected light emission having a wavelength other than a sodium D-line wavelength.

In some embodiments, the chip package 100 has an overall thickness that is close to the thickness of the chip package portion 105 and/or the another chip package portion 125 because the chip package 100 has a light coupling formed in the waveguide layer 103. Having a light coupling formed in the waveguide layer 103 results in a chip package 100 that has a reduced thickness in the z-direction compared to planar lightwave circuits that include a light source positioned above a grating. The chip package 100 having the ridge waveguide structure 117 formed in the waveguide layer 103, accordingly, satisfies the ever increasing demand for reducing chip sizes.

Figure 2:
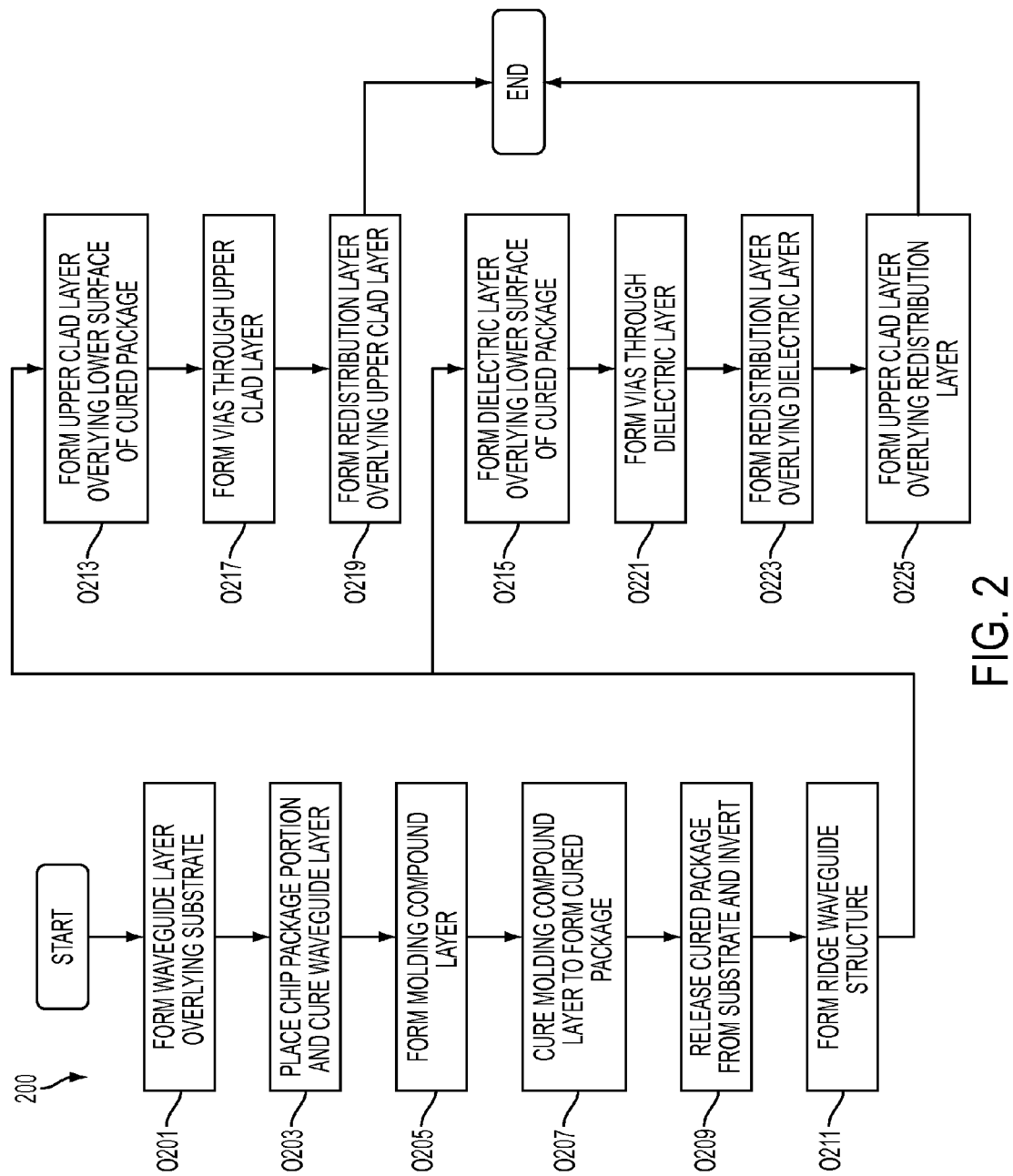
FIG. 2 is a flowchart of a process associated with forming a chip package having a light coupling in a waveguide layer, in accordance with one or more embodiments.

FIG. 2 is a flowchart of a process 200 associated with forming a chip package having a light coupling forming in a waveguide layer, according to one or more embodiments. The process begins with operation O201 in which a waveguide layer is formed overlaying an upper surface of a substrate. In some embodiments, an adhesive layer overlaying an upper surface of a substrate is formed before forming the waveguide layer. If the adhesive layer is formed before the waveguide layer, the waveguide layer is formed overlaying the adhesive layer and the chip package portion is placed in the selected position such that the chip package portion contacts the adhesive layer.

Then, in operation O203, one or more chip package portions such as a laser diode configured to emit a light through a ridge waveguide structure and/or an integrated circuit configured to communicate or control the laser diode is placed within the waveguide layer in a selected position. In some embodiments, the chip package portion is placed in the selected position at a time when the waveguide layer is at room temperature, and the waveguide layer is subsequently cured to secure the chip package portion in the selected position. In some embodiments, the chip package portion is placed in the selected position at a time when the waveguide layer is in a partially cured state, and the waveguide layer is subsequently cured to secure the chip package portion in the selected position.

Next, in operation O205, a molding compound layer is formed overlaying the waveguide layer and the chip package portion. In some embodiments, the molding compound layer is configured to minimize light absorption such as by excluding a black carbon additive.

The process continues with operation O207 in which the molding compound layer is cured to form a cured package, the cured package comprising the waveguide layer, the chip package portion and the molding compound layer, the cured package having an upper surface distal the upper surface of the substrate and a lower surface proximate the upper surface of the substrate. Then, in operation O209, the cured package is released from the substrate and inverted.

Next, in operation O211, a ridge waveguide structure is formed in the waveguide layer by removing a portion of the lower surface of the cured package. In some embodiments, the ridge waveguide structure is formed in the waveguide layer by an etching process. In other embodiments, the ridge waveguide structure is formed separately from the waveguide layer, for example by forming the ridge waveguide structure in a level associated with the waveguide layer after a portion of the waveguide layer is removed.

The process continues to one of operation O213 or operation O215. If the process continues to operation O213, an upper clad layer is formed overlaying the lower surface of the cured package and the ridge waveguide structure. Then, in operation O217, one or more vias are formed through the upper clad layer. Next, in operation O219, a redistribution layer is formed overlaying the upper clad layer, the redistribution layer being communicatively connected to the chip package portion by way of the one or more vias.

If the process continues to operation O215, one or more dielectric layers overlaying the lower surface of the cured package. Then, in operation O221, one or more vias are formed through the one or more dielectric layers. Next, in operation O223, a redistribution layer is formed overlaying the one or more dielectric layers, the redistribution layer being communicatively connected to the chip package portion by way of the one or more vias. Then, in operation O225, an upper clad layer is formed overlaying the redistribution layer.

In some embodiments, regardless of whether the process follows operation O213 or O215, a refractive index difference between one or more of the upper clad layer, the molding compound layer and the waveguide layer is greater than about 0.025.

Figure 3:
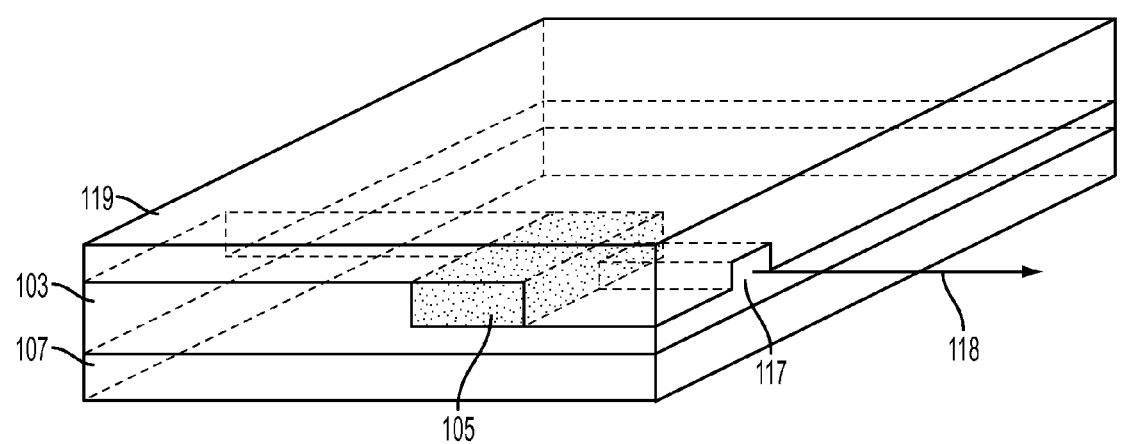
FIG. 3 is an isometric view of a chip package having a light coupling in a waveguide layer, in accordance with one or more embodiments.

FIG. 3 is an isometric view of a chip package having a light coupling formed in a waveguide layer, in accordance with one or more embodiments. The molding compound layer 107 is positioned beneath the waveguide layer 103 and the upper clad layer 119 is formed overlaying the waveguide layer 103, some of which has been removed to form the ridge waveguide structure 117. The chip package portion 105 is a laser diode configured to emit light 118 through the ridge waveguide structure 117 formed in the waveguide layer 103.

One aspect of this description relates to a method of forming a light coupling in a waveguide layer. The method comprises forming a waveguide layer overlaying an upper surface of a substrate. The method also comprises placing a chip package portion within the waveguide layer in a selected position. The method further comprises forming a molding compound layer overlaying the waveguide layer and the chip package portion. The method additionally comprises curing the molding compound layer to form a cured package, the cured package comprising the waveguide layer, the chip package portion and the molding compound layer, the cured package having an upper surface distal the upper surface of the substrate and a lower surface proximate the upper surface of the substrate. The method also comprises releasing the cured package from the substrate. The method further comprises inverting the cured package. The method additionally comprises forming a ridge waveguide structure in the waveguide layer by removing a portion of the lower surface of the cured package.

Another aspect of this description relates to an apparatus such as a light coupling formed in a waveguide layer, the apparatus comprising a ridge waveguide structure. The apparatus also comprises a chip package portion aligned with the ridge waveguide structure. The apparatus further comprises a waveguide layer within which the chip package portion is positioned. The apparatus additionally comprises a cured molding compound layer contacting the waveguide layer and encapsulating the chip package portion with respect to the waveguide layer forming a cured package having an upper surface and a lower surface, the upper surface being associated with a side of the waveguide layer contacting the cured molding compound layer, the lower surface being distal the upper surface. The ridge waveguide structure is formed in the waveguide layer.

Still another aspect of this description relates to a method of forming an integrated circuit having a light coupling in a waveguide layer. The method comprises forming a waveguide layer overlaying an upper surface of a substrate. The method also comprises placing a laser diode within the waveguide layer in a selected position. The method further comprises placing a chip package portion configured to control the laser diode within the waveguide layer in another selected position. The method additionally comprises forming a molding compound layer overlaying the waveguide layer, the laser diode and the chip package portion.

The method also comprises curing the molding compound layer to form a cured package, the cured package comprising the waveguide layer, the laser diode, the chip package portion and the molding compound layer, the cured package having an upper surface distal the upper surface of the substrate and a lower surface proximate the upper surface of the substrate. The method further comprises releasing the cured package from the substrate. The method additionally comprises inverting the cured package.

The method also comprises forming a ridge waveguide structure in the waveguide layer by removing a portion of the lower surface of the cured package, the ridge waveguide structure being aligned with the laser diode, the laser diode being configured to emit a light through the ride waveguide structure. The method further comprises forming an upper clad layer overlaying the lower surface of the cured package. The method additionally comprises forming a redistribution layer overlaying the waveguide layer, the redistribution layer being configured to communicatively couple the laser diode and the chip package portion.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method comprising:
    forming a waveguide layer overlaying an upper surface of a substrate;
    placing a chip package portion within the waveguide layer in a selected position;
    forming a molding compound layer overlaying the waveguide layer and the chip package portion;
    curing the molding compound layer to form a cured package, the cured package comprising the waveguide layer, the chip package portion and the molding compound layer, the cured package having an upper surface distal the upper surface of the substrate and a lower surface proximate the upper surface of the substrate;
    releasing the cured package from the substrate;
    inverting the cured package; and
    forming a ridge waveguide structure in the waveguide layer by removing a portion of the lower surface of the cured package.

2. The method of claim 1, further comprising:
    forming an upper clad layer overlaying the lower surface of the cured package;
    forming one or more vias through the upper clad layer; and
    forming a redistribution layer overlaying the upper clad layer, the redistribution layer being communicatively connected to the chip package portion by way of the one or more vias.

3. The method of claim 1, further comprising:
    forming one or more dielectric layers overlaying the lower surface of the cured package;
    forming one or more vias through the one or more dielectric layers;
    forming a redistribution layer overlaying the one or more dielectric layers, the redistribution layer being communicatively connected to the chip package portion by way of the one or more vias; and
    forming an upper clad layer overlaying the redistribution layer.

4. The method of claim 1, wherein the chip package portion is placed in the selected position at a time when the waveguide layer is at room temperature, the method further comprising:
    curing the waveguide layer to secure the chip package portion in the selected position.

5. The method of claim 1, wherein the chip package portion is placed in the selected position at a time when the waveguide layer is in a partially cured state, the method further comprising:
    curing the waveguide layer to secure the chip package portion in the selected position.

6. The method of claim 1, wherein the molding compound layer is configured to minimize light absorption.

7. The method of claim 2, wherein a refractive index difference between one or more of the upper clad layer, the molding compound layer and the waveguide layer is greater than about 0.025.

8. The method of claim 1, wherein the chip package portion comprises a laser diode configured to emit a light through the ridge waveguide structure.

9. The method of claim 1, further comprising:
    forming an adhesive layer overlaying an upper surface of a substrate, wherein the waveguide layer is formed overlaying the adhesive layer and the chip package portion is placed in the selected position such that the chip package portion contacts the adhesive layer.

10. The method of claim 1, wherein the ridge waveguide structure is formed in the waveguide layer by an etching process.

11. The method of claim 1, wherein forming the ridge waveguide structure in the waveguide layer comprises forming the ridge waveguide structure in a level associated with the waveguide layer and the ridge waveguide structure is formed separately from the waveguide layer.

12. An apparatus comprising:
a ridge waveguide structure;
a chip package portion aligned with the ridge waveguide structure;
a waveguide layer within which the chip package portion is positioned; and
a cured molding compound layer contacting the waveguide layer and encapsulating the chip package portion with respect to the waveguide layer forming a cured package having an upper surface and a lower surface, the upper surface being associated with a side of the waveguide layer contacting the cured molding compound layer, the lower surface being distal the upper surface,
wherein the ridge waveguide structure is in the waveguide layer, and the upper surface of the waveguide layer outside the ridge waveguide structure is in contact with the chip package portion.

13. The apparatus of claim 12, further comprising:
an upper clad layer overlaying the lower surface of the cured package;
one or more vias formed through the upper clad layer; and
a redistribution layer overlaying the upper clad layer, the redistribution layer being communicatively connected to the chip package portion by way of the one or more vias.

14. The apparatus of claim 12, further comprising:
one or more dielectric layers overlaying the lower surface of the cured package;
one or more vias formed through the one or more dielectric layers;
a redistribution layer overlaying the one or more dielectric layers, the redistribution layer being communicatively connected to the chip package portion by way of the one or more vias; and
an upper clad layer overlaying the redistribution layer.

15. The apparatus of claim 12, wherein the cured molding compound layer is configured to minimize light absorption.

16. The apparatus of claim 13, wherein a refractive index difference between one or more of the upper clad layer, the cured molding compound layer and the waveguide layer is greater than about 0.025.

17. The apparatus of claim 12, wherein the chip package portion comprises a laser diode configured to emit a light through the ridge waveguide structure.

18. The apparatus of claim 12, wherein the ridge waveguide structure is formed in the waveguide layer by an etching process.

19. The apparatus of claim 12, wherein forming the ridge waveguide structure in the waveguide layer comprises forming the ridge waveguide structure in a level associated with the waveguide layer and the ridge waveguide structure is formed separately from the waveguide layer.

20. A method of forming an integrated circuit, the method comprising:
forming a waveguide layer overlaying an upper surface of a substrate;
placing a laser diode within the waveguide layer in a selected position;
placing a chip package portion configured to control the laser diode within the waveguide layer in another selected position;
forming a molding compound layer overlaying the waveguide layer, the laser diode and the chip package portion;
curing the molding compound layer to form a cured package, the cured package comprising the waveguide layer, the laser diode, the chip package portion and the molding compound layer, the cured package having an upper surface distal the upper surface of the substrate and a lower surface proximate the upper surface of the substrate;
releasing the cured package from the substrate;
inverting the cured package; and
forming a ridge waveguide structure in the waveguide layer by removing a portion of the lower surface of the cured package, the ridge waveguide structure being aligned with the laser diode, the laser diode being configured to emit a light through the ride waveguide structure;
forming an upper clad layer overlaying the lower surface of the cured package; and
forming a redistribution layer overlaying the waveguide layer, the redistribution layer being configured to communicatively couple the laser diode and the chip package portion.

* * * * *